United States Patent [19]

Schiess

[11] 3,715,621

[45] Feb. 6, 1973

[54] TRANSISTOR DEFLECTION CIRCUITS UTILIZING A CLASS B, PUSH-PULL OUTPUT STAGE

[75] Inventor: George Schiess, Stallikon, Switzerland

[73] Assignee: RCA Corporation

[22] Filed: March 3, 1970

[21] Appl. No.: 16,130

[30] Foreign Application Priority Data

March 3, 1969 Great Britain ....................11,212/69

[52] U.S. Cl. ..............................................315/27 TD

[51] Int. Cl. ..............................................H01j 29/70

[58] Field of Search ............................315/27, 28, 29

[56] References Cited

UNITED STATES PATENTS

| | | | |
|---|---|---|---|
| 3,434,004 | 3/1969 | Smeulers et al. | 315/27 TD |
| 3,424,941 | 1/1969 | McDonald et al. | 315/27 TD |
| 2,911,566 | 11/1959 | Taylor et al. | 315/27 TD |

*Primary Examiner*—Carl D. Quarforth
*Assistant Examiner*—J. M. Potenza
*Attorney*—Eugene M. Whitacre

[57] ABSTRACT

Transistorized vertical deflection circuit employs a multi-stage deflection wave amplifier including an output stage of a Class B, push-pull, complementary-symmetry type, with vertical yoke windings driven by output stage emitters. Ground return for vertical yoke windings is effected via path including electrolytic capacitor and current sampling resistor, with the capacitor blocking the flow through the yoke windings of direct current from the output stage. Deflection circuit employs Miller Integrator approach to sawtooth wave generation, developing sawtooth wave across a second capacitor included in a negative feedback path looped about the multi-stage deflection amplifier, the feedback voltage being derived from the current sampling resistor. Feedback use enables employment of relatively low-valued electrolytic capacitor for the D.C. blocking function without introducing undesired distortion of deflection current waveform. Vertical rate parabolic voltage developed across low-valued electrolytic capacitor is of adequate magnitude to serve as input waveform for vertical dynamic convergence circuits. In one embodiment, electrolytic capacitor serves as parabola source for additional feedback to Miller Integrator input in order to effect S-shaping of deflection wave.

10 Claims, 6 Drawing Figures

INVENTOR.
GEORGE SCHIESS
BY William H. Meagher
Attorney

INVENTOR.
GEORGE SCHIESS
BY William H. Meagher
Attorney

INVENTOR.
GEORGE SCHIESS

BY William H. Meagher

Attorney

TRANSISTOR DEFLECTION CIRCUITS UTILIZING A CLASS B, PUSH-PULL OUTPUT STAGE

This application relates to transistorized deflection circuits, and particularly to transistor circuits suitable for effecting the vertical deflection function in television receivers.

In most television receivers produced heretofore, the vertical deflection windings of the receiver's deflection yoke have been driven by a power output device (tube or transistor) via a transformer required for impedance matching purposes. However, it has been recognized in the prior art that a vertical deflection output stage in the form of a Class B, push-pull, complementary-symmetry transistor stage presents the advantage of permitting elimination of the conventional output transformer. In one example, disclosed in an article by G. C. Sziklai, et al., entitled "A Study of Transistor Circuits For Television," and appearing in the June, 1953 issue of the Proceedings of the IRE, the joined emitters of the NPN and PNP output transistors are directly connected to the vertical deflection winding load, and undesired (decentering) flow of direct current through the windings is avoided by return of the respective collectors to power supply potentials of equal magnitude but opposite polarity. Such an arrangement has the disadvantage, for home receiver use, of its need for a special, "split" power supply.

In the absence of a "split" power supply, undesired decentering may be avoided by employing a D.C. blocking capacitor in the coupling between the yoke windings and the emitters of the complementary pair. Such an arrangement is shown, for example, in U.S. Pat. No. 2,950,346, issued on Aug. 23, 1960 to Larry A. Freedman and Roland N. Rhodes. In this arrangement, however, the blocking capacitor must have quite a large capacitance value (e.g., 1,000 microfarads or more) if its interposition is not to introduce undesired distortion of the sawtooth waveform of the deflection current.

In U.S. Pat. No. 2,964,673, issued on Dec. 13, 1960 to Thomas O. Stanley, there is disclosed a transistor vertical deflection circuit in which a Miller Integrator approach to sawtooth wave generation is associated with a complementary-symmetry output stage; the sawtooth capacitor is included in a negative feedback path coupled between the high potential side of the deflection windings and the input of a deflection amplifier. In this arrangement, the linearizing effect of the negative feedback is such that a relatively low value can be tolerated for the D.C. blocking capacitor without seriously distorting the deflection current waveform.

The present invention is concerned with the derivation of a vertical rate waveform of parabolic shape from a transistor vertical deflection circuit of the advantageous complementary-symmetry output stage type. Such a waveform may be required, for example where the receiver is a color television receiver, as an input to the receiver's dynamic convergence circuits. Waveform sources conventionally available in tube deflection circuits for convergence takeoff use (e.g., at points such as the vertical output tube cathode or a secondary winding of the vertical output transformer) have no direct counterparts in the complementary-symmetry transistor arrangement.

Pursuant to the principles of the present invention, undesired direct current from the complementary output pair is blocked by an electrolytic capacitor located in the ground return of the vertical deflection windings in series with a current sampling resistor. A negative A.C. feedback path is established between the junction of the capacitor and the sampling resistor and the input of the vertical deflection amplifier. Advantage is taken of the linearizing effect of the negative feedback to permit choice of a relatively low value (e.g., 250 microfarads or less) for the electrolytic capacitor without introducing waveform distortion. With such a value and in the noted location (at the low potential side of the deflection windings), the blocking capacitor conveniently serves as a source of an adequate magnitude of vertical parabola voltage for convergence circuit use.

Another function that may be served by the blocking capacitor in the above-described circuit configuration, pursuant to a further embodiment of the present invention, is provision of a vertical parabola waveform for application to the input of the vertical deflection amplifier to effect S-shaping of the deflection waveform.

Accordingly, it is an object of the present invention to provide a novel and improved transistor deflection circuit. A further specific object of the present invention is to provide a novel configuration for a transistor vertical deflection circuit using a complementary-symmetry output pair, which configuration facilitates the derivation therefrom of a voltage component of vertical rate and parabolic wave shape.

Other objects and advantages of the present invention will be readily recognized by those skilled in the art upon reading of the following detailed description, and an inspection of the accompanying drawings in which:

FIGS. 1*a*, 1*b* and 1*c* are schematic illustrations of prior art deflection circuit arrangements using a complementary-symmetry output stage;

Figures 1A, 1B, 1C, 2:
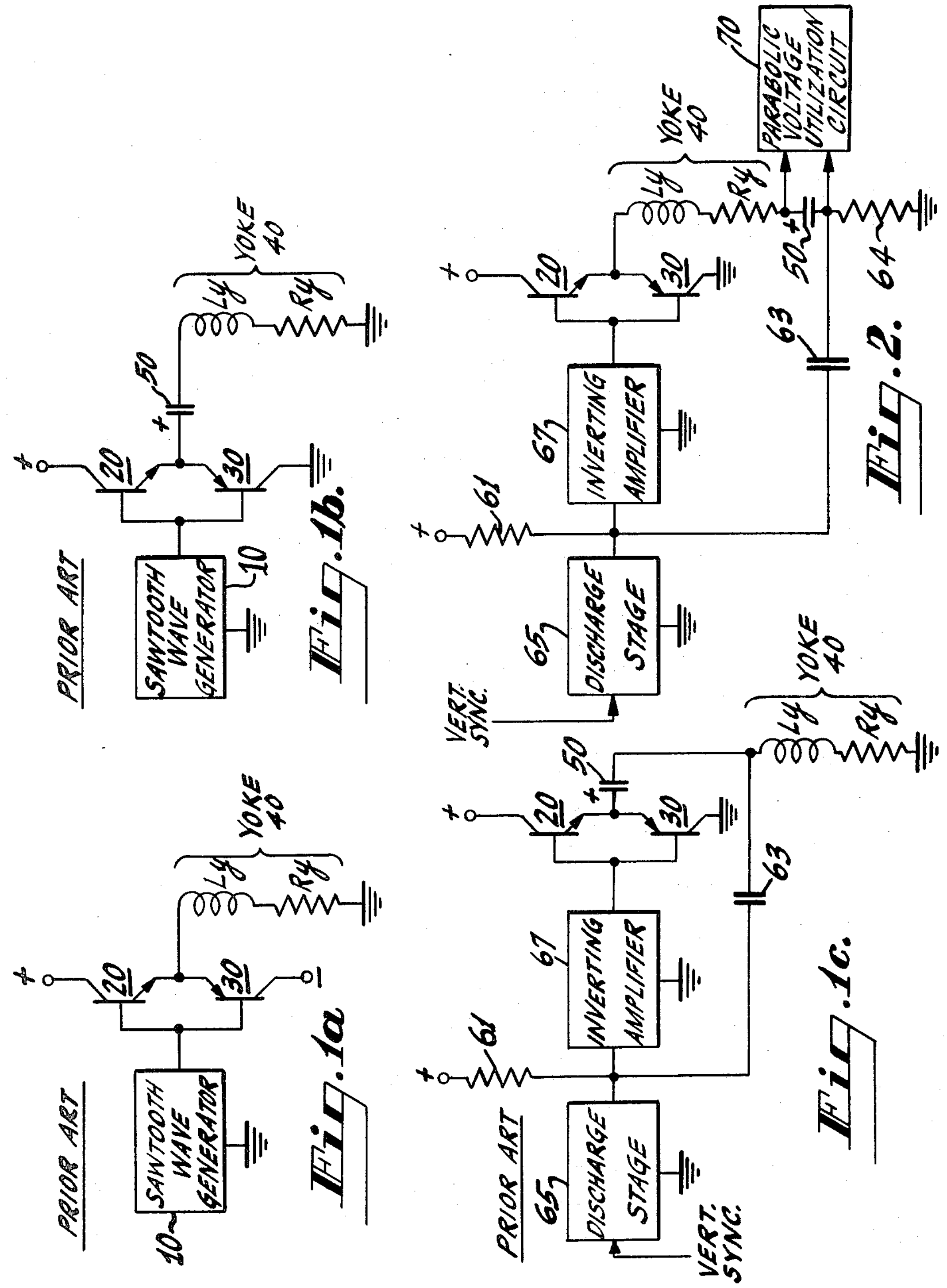
FIG. 2 is an illustration, partially schematic and partially in block diagram form, of a transistor vertical deflection circuit embodying the principles of the present invention.

FIG. 1*a* is a simplified showing of a prior art vertical deflection circuit employing a complementary output pair, the circuit being of the previously discussed type shown in the Sziklai, et al. article. A sawtooth voltage wave developed by a sawtooth wave generator 10 is applied, in common, to the respective base electrodes of an NPN transistor 20 and a PNP transistor 30. The emitter electrodes of the transistors 20 and 30 are connected together, and returned to ground via a load constituted by yoke 40; yoke 40 is diagrammatically shown as incorporating an inductive component $L_y$ and a resistive component $R_y$, and, illustratively, represents the vertical deflection windings in a television receiver. The collector electrode of the NPN transistor 20 is connected to a suitable unidirectional voltage supply of positive polarity relative to ground, while the collector electrode of the PNP transistor 30 is connected to a unidirectional potential supply of negative polarity relative to ground. With suitably matched devices and supplies, the D.C. potential at the joined emitters will correspond to ground potential, and no undesired direct current will flow in the load.

FIG. 1*b* illustrates another prior art approach, exemplified by the aforementioned Freedman, et al. patent, involving a D.C. potential supply of only one polarity. Again, the voltage output of a sawtooth wave generator 10 is applied, in common, to the respective base electrodes of the complementary transistor pair 20 and 30. The collector of the PNP transistor 30 is grounded, while the collector of the NPN transistor is connected to a point of positive supply potential. The emitters of the complementary pair are connected together, and coupled via an electrolytic capacitor 50 to the load constituted by yoke 40. While the joined emitters are now at an elevated D.C. potential relative to ground, undesired direct current is precluded from flowing in the yoke 40 due to the blocking effect of the interposed capacitor 50.

FIG. 1c illustrates another prior art approach in which a form of "Miller Integrator" action is associated with the use of a complementary output pair, as in the previously mentioned Stanley patent. Here, the arrangement of the D.C. supply, the complementary transistors 20 and 30, the blocking capacitor 50 and the yoke 40 is similar to that of FIG. 1*d*. However, the sawtooth wave generator, supplying an input to the output pair, is shown in more detail, and involves a feedback capacitor 63 coupled to the junction of capacitor 50 and yoke 40. A charging source for capacitor 63 includes a charging resistor 61 connected to the positive supply potential source. A discharge stage 65 is connected to the junction of resistor 61 and capacitor 63; under suitable control of vertical synchronizing pulses, the discharge stage 65 serves to periodically short the resistor-capacitor junction to ground, discharging the capacitor 63.

The sawtooth voltage waveform developed at the resistor-capacitor junction by the successive charging and discharging of capacitor 63 is applied via a phase inverting amplifier 67 to the base electrodes of output transistors 20 and 30. Due to the waveform linearizing effect of the negative A.C. feedback in this circuit, the capacitor 50 may have a smaller capacitance value than that tolerable for the capacitor 50 of the FIG. 1b circuit without introducing significant distortion of the deflection waveform.

FIG. 2 illustrates in simplified form an embodiment of the present invention. As in FIG. 1c, charging resistor 61 and synchronized discharge stage 65 cooperate with a feedback capacitor 63 to develop a sawtooth waveform, which is applied via a phase inverting amplifier 67 to the base electrodes of complementary output transistors 20 and 30. However, the feedback voltage is derived from a current sampling resistor 64, and the electrolytic capacitor 50 is shifted to the ground return side of yoke 40, such that it is interposed in series between the yoke 40 and the sampling resistor 64. The junction of capacitor 50 and resistor 64 provides the takeoff point for negative A.C. feedback to the input of inverting amplifier 67. By virtue of the linearizing effect of the negative A.C. feedback, a relatively low capacitance value may be used for the electrolytic capacitor 50 without significant distortion of the deflection current waveform. With choice of such a relatively low value (e.g., 250 microfarads), the flow of deflection current of sawtooth waveshape in the load circuit results in the development of a vertical rate parabolic voltage of usable magnitude across capacitor 50. A parabolic voltage utilization circuit 70 is, accordingly, coupled across capacitor 50 and responds to such developed voltage.

Figure 3:
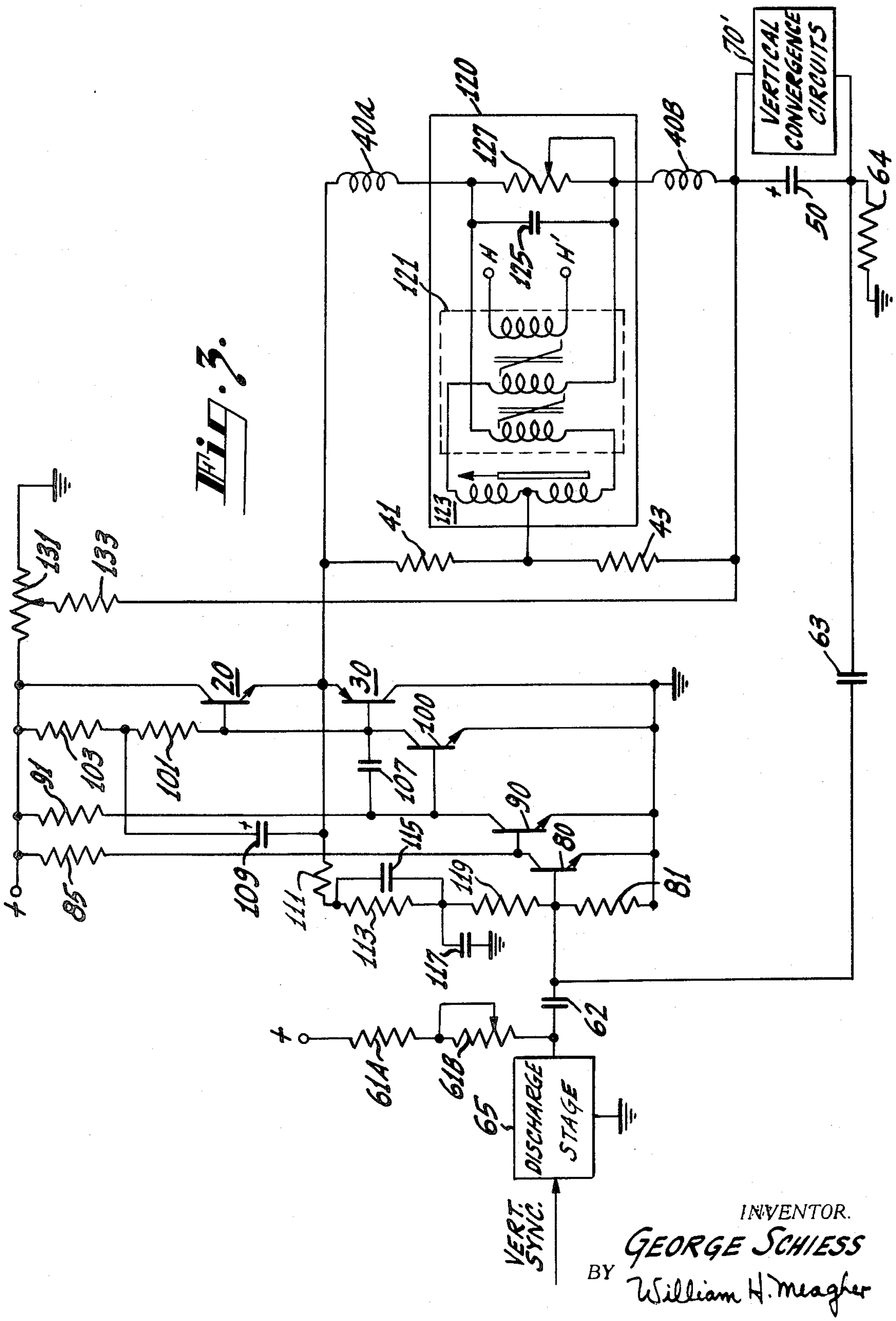
FIG. 3 illustrates in schematic detail a modification of the circuitry of FIG. 2 for use in a color television receiver in accordance with a further embodiment of the present invention.

As previously discussed, the utilization circuit 70 may comprise, for example, the vertical rate dynamic convergence circuitry of a color television receiver. FIG. 3 illustrates in considerable schematic detail a color television receiver vertical deflection circuit embodying the present invention, and using the derived parabolic voltage for the aforementioned convergence purposes.

Wherever possible, the same reference numerals employed in FIG. 2 are re-employed in FIG. 3 to designate components of similar function.

As in FIG. 2, the joined emitters of the complementary output transistor pair 20 and 30 are returned to ground via a path including, in series, the vertical deflection windings, the electrolytic capacitor 50 and the current sampling resistor 64. The deflection winding structure is represented schematically in FIG. 3 by separate coils 40A and 40B corresponding to respective halves of the vertical deflection winding. Respective shunt damping resistors 41 and 43 are associated with the respective winding halves 40A and 40B. The junction of the damping resistors 41 and 43 is connected to the yoke midpoint by means of top-and-bottom pincushion correction apparatus 120. The pincushion correction apparatus 120 is illustrated schematically as taking the saturable reactor form disclosed, for example, in U.S. Pat. No. 3,329,859, issued to Eugene Lemke on July 4, 1967. In such apparatus, a saturable reactor 121 includes an input winding energized by a horizontal rate waveform from a suitable source H, H′ in the receiver's horizontal deflection circuits (not illustrated). Output windings of the saturable reactor 121 are connected in series with an adjustable inductor 123 to form a series combination, across which is shunted the parallel combination of a tuning capacitor 125 and a variable resistor 127. This network is connected to the vertical deflection winding halves 40A and 40B so that the vertical deflection current traverses the reactor output windings. By virtue of the reactor operation, the network serves as a source of horizontal frequency waves of a first polarity and continuously diminishing amplitude during the first half of vertical scanning, and of opposite polarity and of a continuously increasing amplitude during the last half of vertical scanning. The combination of the reactor output windings, the inductor 123 and the capacitor 125 is resonant at the horizontal frequency, whereby the waveform supplied is substantially sinusoidal. Inductor 123 provides a facility for adjusting the phasing of the horizontal waveform, while the Q-controlling resistor 127 provides a facility for adjusting the magnitude of the correcting waveform.

As in FIG. 2, the FIG. 3 circuit incorporates a feedback capacitor 63, coupled between the junction of capacitor 50 and resistor 64 and the input of an inverting amplifier which drives the base electrodes of the output transistors. The inverting amplifier includes three grounded-emitter amplifier stages in cascade, utilizing the respective transistors 80, 90 and 100. The base emitter path of the input transistor 80 is shunted by an input resistor 81. The collector of transistor 80 is directly connected to the base of transistor 90, and is returned to a positive D.C. supply via collector resistor 85. The collector of transistor 90 is directly connected to the base of transistor 100, and is returned to the positive D.C. supply by means of collector resistor 91. The collector of transistor 100 is directly connected to the respective base electrodes of the output transistor pair 20 and 30, and is returned to the positive D.C. supply by the series combination of resistors 101 and 103.

A small-valued capacitor 107, coupled between the collector and base electrodes of transistor 100, provides degeneration at high frequencies, serving to preclude undesired high frequency oscillations in the high gain amplifier.

"Bootstrap" capacitor 109 is coupled between the common emitter output terminal O and the junction of resistors 101 and 103. The positive feedback effected by this connection aids in efficiency of signal transfer between transistor 100 and the output transistor pair, as explained more fully in U.S. Pat. No. 2,810,024, issued to Thomas O. Stanley on Oct. 15, 1957.

Operating point stabilization for the output transistor pair is ensured by a negative D.C. feedback effected by providing a D.C. path between the common emitter output terminal and the base of input transistor 80, this D.C. path including, in series, resistors 111, 113 and 119. An additional function associated with this feedback path will be subsequently described.

As in FIG. 2, "Miller Integrator" action is employed for sawtooth wave generation in the FIG. 3 circuit. Feedback capacitor 63 is charged via a path including, in series, a fixed charging resistor 61A, a variable charging resistor 61B and a coupling capacitor 62. A discharge stage 65 coupled to the junction of resistor 61B and capacitor 62 serves to periodically discharge capacitors 62 and 63, under suitable vertical sync pulse control. Variable resistor 61B provides a height control facility for adjusting the magnitude of the generated sawtooth wave. The FIG. 3 circuit additionally provides a facility for vertical centering adjustments. For this purpose, a direct current path is provided between the junction of coil 40B and capacitor 50 and an adjustable D.C. source provided by potentiometer 131, the D.C. path including a current limiting resistor 133. Adjustment of the tap on potentiometer 131 permits a selected small amount of direct current to flow through the vertical deflection winding halves 40A and 40B.

S-shaping of the vertical deflection current waveform is achieved in the FIG. 3 circuit by allowing a suitably shaped version of the output waveform at the common emitter output terminal O to be fed back to the base of input transistor 80 (in addition to the stabilizing D.C. feedback) via the previously mentioned feedback path incorporating resistors 111, 113 and 119. To effect the desired A.C. feedback wave shaping, a capacitor 115 is connected in parallel with resistor 113, and a capacitor 117 is connected between ground and the junction of resistors 113 and 119. Shunt capacitor 117 cooperates with the series resistance elements 111 and 113 to integrate the output voltage and to provide a resultant voltage of parabolic waveshape. Capacitor 115 introduces a phase shift of the parabola crest to obtain correct symmetry. Resistor 119, in cooperation with the capacity exhibited at the inverting amplifier input provides a succeeding integration to introduce the S-shaping component.

The electrolytic capacitor 50, in the ground return connection of the vertical deflection windings, develops a parabolic voltage across its terminals as the sawtooth deflection current is passed by the capacitor. This vertical rate parabolic waveform is used to energize vertical convergence circuit 70', connected across the capacitor terminals. Reference may be made, for example, to U.S. Pat. No. 3,491,261 issued to Hill, et al. on Jan. 20, 1970, for a particular example of vertical convergence circuits that may be advantageously energized in this fashion.

A set of values for the various components of FIG. 3 is given, by way of example only, in Table 1 below. Use of such values has provided satisfactory operation of the illustrated circuitry for 90° deflection in association with a D.C. supply of +50 volts for the transistor amplifier stages, and with a stabilized +15 volt supply as the source of charging current for capacitor 63.

TABLE 1 — FIGURE 3 COMPONENT VALUES

| | |
|---|---|
| Resistor **41** | 220 ohms |
| Resistor **43** | 220 ohms |
| Resistor **61A** | 220,000 ohms |
| Resistor **61B** | 100,000 ohms |
| Resistor **64** | 3.3 ohms |
| Resistor **81** | 10,000 ohms |
| Resistor **85** | 470,000 ohms |
| Resistor **91** | 68,000 ohms |
| Resistor **101** | 820 ohms |
| Resistor **103** | 1,200 ohms |
| Resistor **111** | 150,000 ohms |
| Resistor **113** | 220,000 ohms |
| Resistor **119** | 100,000 ohms |
| Resistor **127** | 15,000 ohms |
| Resistor **131** | 5,000 ohms |
| Resistor **133** | 1,800 ohms |
| Capacitor **50** | 100 microfarads |
| Capacitor **62** | 2.2 microfarads |
| Capacitor **63** | 0.47 microfarad |
| Capacitor **107** | 330 picofarads |
| Capacitor **109** | 10 microfarads |
| Capacitor **115** | 0.01 microfarad |
| Capacitor **117** | 0.33 microfarad |
| Capacitor **125** | 0.068 microfarad |
| Coil **40A** | 18.5 ohms, 23.5 millihenries |
| Coil **40B** | 18.5 ohms, 23.5 millihenries |
| Transistor **20** | Type TA7290 |
| Transistor **30** | Type TA7271 |
| Transistor **80** | Type 2N5183 |
| Transistor **90** | Type BC108 |
| Transistor **100** | Type 2N5184 |

Figure 4:
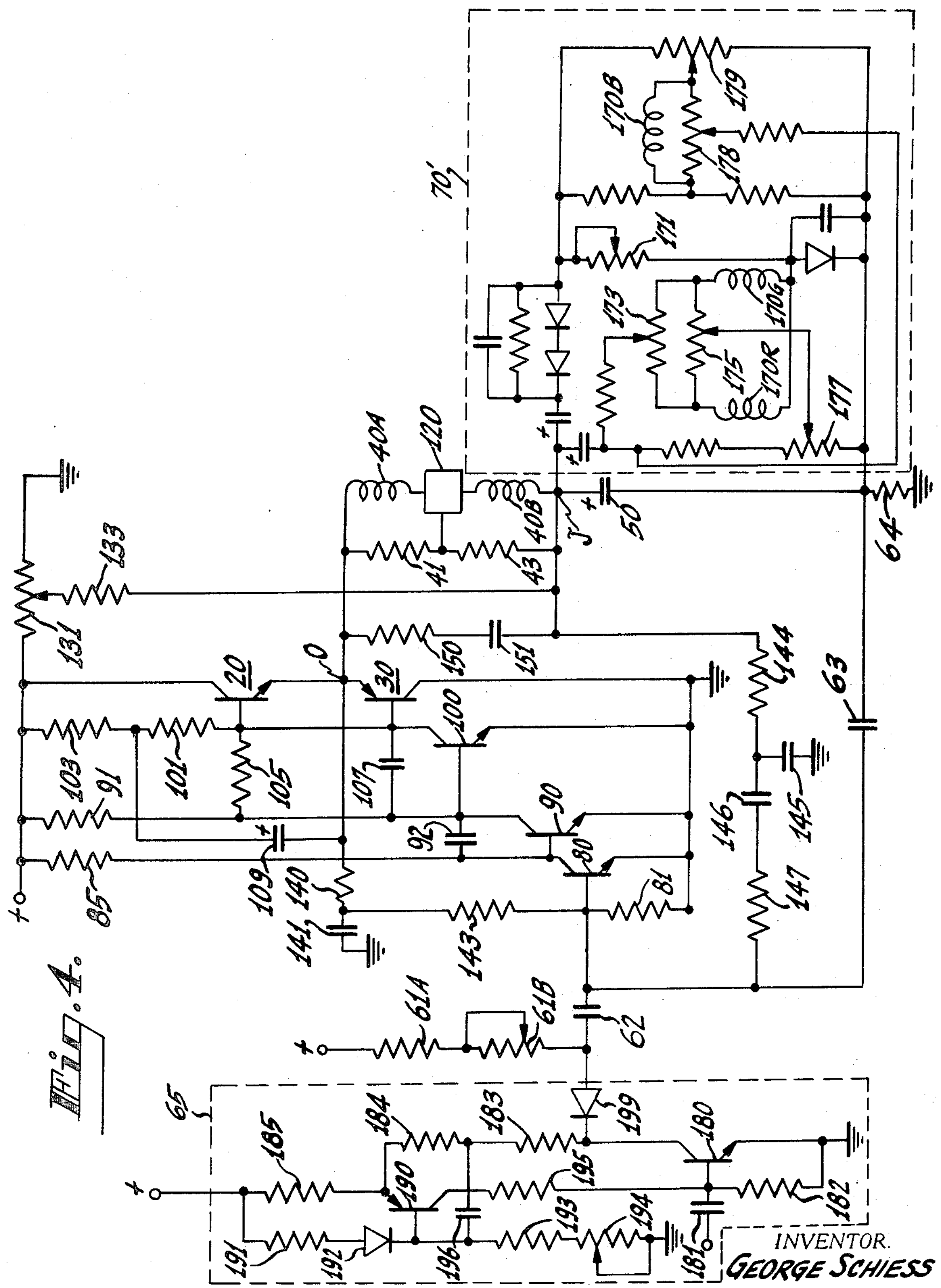
FIG. 4 illustrates in schematic detail an alternative modification of the circuitry of FIG. 2 for use in a color television receiver in accordance with an additional embodiment of the present invention.

FIG. 4 illustrates a modification of the circuitry of FIG. 3. A substantial portion of the circuitry of FIG. 4 is essentially identical with FIG. 3, and need not be described again in detail.

In FIG. 4, the feedback network disposed between the common emitter output terminal O and the base of input transistor 80 differs from the feedback network of FIG. 3. The network includes a pair of resistors 140 and 143, in series, between terminal O and the base of transistor 80, and a capacitor 141 connected between ground and the junction of the series resistors. The values of resistor 140 and capacitor 141 are chosen so as to effect severe filtering of the A.C. output waveform, thereby effectively confining the feedback via this network to a D.C. component only. The network thus performs an operating point stabilization function, as in FIG. 3, but does not serve in an additional S-shaping capacity, as was the case in FIG. 3.

In FIG. 4, the desired S-shaping of the deflection current waveform is effected by a technique illustrating another form of utilization of the parabolic voltage wave component developed across the electrolytic capacitor 50. As in the preceding embodiment, capacitor 50 is located in the ground return connection of the yoke windings (40A, 40B) in series with the current sampling resistor 64, and the voltage waveform appearing across resistor 64 is fed back to the input of the deflection amplifier via capacitor 63. Again, advantage is taken of the linearizing effect of the negative AC feedback to provide a relatively low value for capacitor 50, whereby a parabolic voltage component of significant magnitude is developed across capacitor 50 as it is traversed by the deflection current. The voltage at the junction J of coil 40B and capacitor 50, relative to ground, represents the sum of this parabolic component and the sawtooth voltage component developed across resistor 64. With a suitably small value for the sampling resistor 64 (e.g., 1 ohm), the waveshape of the composite voltage at junction J is a slightly tilted parabola; feedback of this voltage to the amplifier input for integration thereat introduces the desired S-shaping of the deflection current.

The parabola feedback network includes resistor 144, coupling capacitor 146, and resistor 147, connected in series between junction J and the base of input transistor 80, and a capacitor 145 connected between ground and the junction of resistor 144 and capacitor 146. Series resistor 144 and shunt capacitor 145 provide a phase shift of the parabolic component, permitting optimization of the symmetry of the S-shaping effect. Capacitor 146 merely serves to block direct current, and preferably has a sufficiently large value to have negligible influence on the S-shaping waveform. Resistor 147 cooperates with the capacity exhibited at the amplifier input to provide the parabola integration necessary for S-component introduction, and the value of resistor 147 is predominantly determinative of the magnitude of the resultant correction.

Apart from the feedback network differences noted above, the deflection circuit of FIG. 4 differs but slightly from that of FIG. 3. In FIG. 4, the high frequency oscillation suppression function of feedback capacitor 107 is supplemented by capacitor 92 which provides degenerative feedback at high frequencies between the collector and base of transistor 90. Operating point stabilization of the output driver transistor 100 is enhanced by an additional negative D.C. feedback provided by resistor 105, connected between the collector and base of transistor 100.

Schematic details for the vertical convergence circuit 70′, coupled across the electrolytic capacitor 50, are illustrated in FIG. 4 for the sake of completeness of showing of a practical circuit embodying the present invention. It will be readily recognized that other forms of convergence circuitry may be substituted without departing from the principles of the present invention.

The particular convergence circuit arrangement chosen for illustration is that of the aforementioned U.S. Pat. No. 3,491,261 Hill, et al. Coils 170R, 170G and 170B are vertical convergence windings selectively affecting the red, green and blue beams, respectively, of the receiver's color kinescope. Variable resistor 171 constitutes a master amplitude control for red/green winding currents in the last half of the vertical scan interval, thus providing a facility for red/green vertical line alignment at the raster bottom. Potentiometer 177 constitutes a master amplitude control for red/green winding currents in the first half of the vertical scan interval, facilitating vertical line alignment at the raster top. Potentiometer 173 constitutes a differential amplitude control for red/green winding currents in the beginning-of-scan period, thus providing a facility for horizontal red/green line alignment at the raster top, while potentiometer 175 provides end-of-scan differential control for horizontal line alignment at raster bottom. The direction and magnitude of blue beam shifts along a vertical axis at the raster top is controlled by tap adjustment on potentiometer 178, while potentiometer 179 provides a similar control for the raster bottom. Reference may be made to the aforementioned Hill, et al. patent for an explanation of the operating principles of the circuit, which need not be further explained here.

Also schematically illustrated in FIG. 4, for the sake of completeness, is an example of one form which the discharge stage 65 may take. The illustrated form is a type of self-oscillating discharge stage, which may be characterized as a transformerless blocking oscillator (with the usual phase-inverting transformer replaced by a transistor).

The discharge stage 65 includes an NPN transistor 180 with its emitter grounded, its base returned to ground via a resistor 182 and coupled to a sync pulse input terminal via a capacitor 181, and its collector connected to a positive D.C. supply via the series combination of resistors 183, 184 and 185. Resistor 185 constitutes the emitter resistor of a PNP transistor 190. The base of transistor 190 is connected to the positive D.C. supply via the series combination of a diode 192 and a resistor 191, and is returned to ground via a resistor 193 in series with a variable resistor 194. A capacitor 196 couples an intermediate point in the transistor 180 collector circuit (i.e., the junction of resistors 183 and 184) to the base of transistor 190, while a resistor 195 couples the collector of transistor 190 to the base of transistor 180.

At the beginning of the retrace period, both transistors 180 and 190 are conducting. The capacitor 196 is rapidly charged from the D.C. supply via two parallel paths: (a) resistor 191 in series with diode 192, and (b) resistor 185 in series with the base-emitter path of transistor 190. The charging circuit is completed via resistor 183 and the conducting transistor 180. As capacitor 196 becomes charged, the voltage at the base of transistor 190 rises in a positive direction until transistor 190 and diode 192 are cut off. Due to the coupling provided via resistor 195, turnoff of transistor 190 drives transistor 180 into cut-off also, and the trace interval begins.

The trace interval continues, with transistors 180 and 190 non-conducting, while capacitor 196 discharges via a path including resistors 193 and 194. As determined by the discharge time constant, subject to adjustment by variation of hold control resistor 194, the voltage at the base of transistor 190 will finally drop to a level permitting transistor 190 to resume conduction and, in turn, to drive transistor 180 into conduction. The collector current of transistor 180 produces a voltage drop across resistor 185, dropping the emitter potential of transistor 190 sufficiently to enable diode 92 to conduct. Diode 92, by conducting a portion of the charging current for capacitor 196, serves to prevent the transistors from going into saturation and remaining in the saturated state.

The conduction of transistor 180 during each retrace interval serves to provide a conducting path via coupling diode 199 for periodically discharging the sawtooth capacitor 63. During the trace interval, diode 199 is nonconducting so that the deflection amplifier is isolated from the oscillator circuit. Synchronization of the oscillations of the discharge stage is readily effected by applying vertical sync pulses via capacitor 181 to the base of transistor 180.

A set of values for the various components of FIG. 4 is given, by way of example only, in Table II below. Use of such values has provided satisfactory operation of the illustrated circuitry for 110° deflection, in association with a D.C. supply of +40 volts for the deflection amplifier stages, and with a stabilized +30 volt supply for the discharge stage transistors serving also as the source of charging current for capacitor 63.

TABLE II —FIGURE 4 COMPONENT VALUES

| | |
|---|---|
| Resistor **41** | 220 ohms |
| Resistor **43** | 220 ohms |
| Resistor **61A** | 330,000 ohms |
| Resistor **61B** | 100,000 ohms |
| Resistor **64** | 1.0 ohm |
| Resistor **81** | 10,000 ohms |
| Resistor **85** | 470,000 ohms |
| Resistor **91** | 68,000 ohms |
| Resistor **101** | 560 ohms |
| Resistor **103** | 680 ohms |
| Resistor **105** | 15,000 ohms |
| Resistor **131** | 2,200 ohms |
| Resistor **133** | 1,000 ohms |
| Resistor **140** | 220,000 ohms |
| Resistor **143** | 150,000 ohms |
| Resistor **144** | 22,000 ohms |
| Resistor **147** | 180,000 ohms |
| Resistor **150** | 2,200 ohms |
| Resistor **182** | 10,000 ohms |
| Resistor **183** | 15,000 ohms |
| Resistor **184** | 680 ohms |
| Resistor **185** | 220 ohms |
| Resistor **191** | 820 ohms |
| Resistor **193** | 150,000 ohms |
| Resistor **194** | 50,000 ohms |
| Resistor **195** | 22,000 ohms |
| Capacitor **50** | 250 microfarads |
| Capacitor **62** | 2.2 microfarads |
| Capacitor **63** | 1.0 microfarad |
| Capacitor **92** | 470 picofarads |
| Capacitor **107** | 1000 picofarads |
| Capacitor **109** | 50 microfarads |
| Capacitor **141** | 1.6 microfarads |
| Capacitor **145** | 0.1 microfarad |
| Capacitor **146** | 0.82 microfarad |
| Capacitor **151** | 0.01 microfarad |
| Capacitor **181** | 0.22 microfarad |
| Capacitor **196** | 0.47 microfarad |
| Coil **40A** | 7.5 ohms, 12.5 millihenries |
| Coil **40B** | 7.5 ohms, 12.5 millihenries |
| Transistor **20** | Type 2N5293 or Type 2N5294 |
| Transistor **30** | Type 40626 |
| Transistors **80, 90** | Type BC108A or Type BC183A |
| Transistor **100** | Type 2N5184 |
| Transistor **180** | Type BC107A or Type 2N3704 |
| Transistor **190** | Type BC177 or Type 2N3702 |

What is claimed is:

1. A transistor vertical deflection circuit for use in a television receiver comprising, in combination:

a deflection wave amplifier having an input terminal;

a deflection wave output stage having an output terminal, said deflection wave amplifier and output stage being connected in cascade to provide at said output terminal an output deflection waveform which is inverted in phase relative to an input deflection waveform appearing at said input terminal;

a deflection coil;

a first capacitor;

a deflection current sampling resistor;

means coupling said deflection coil, said first capacitor and said current sampling resistor in series, in the order named, between said output terminal and a point of reference potential;

means coupled to the junction of said first capacitor and said resistor for establishing a negative feedback path between said junction and said input terminal, said negative feedback path including a second capacitor;

means, including a discharge stage coupled to said input terminal, for alternately charging and discharging said second capacitor at a vertical deflection rate to develop at said input terminal a sawtooth voltage wave as said input deflection waveform; and wave shaping means having an input coupled to said first capacitor and responsive to a parabolic voltage component developed across said first capacitor.

2. Apparatus in accordance with claim 1 wherein said output stage includes a pair of transistors of opposite conductivity types disposed in a push-pull, complementary-symmetry configuration, direct current conductive connections being provided between the emitter electrodes of said transistors and said output terminal.

3. A transistor vertical deflection circuit for use in a television receiver with a color image reproducer employing dynamic beam convergence apparatus comprising, in combination:

a deflection wave amplifier having an input terminal;

a deflection wave output stage having an output terminal, said deflection wave amplifier and output stage being connected in cascade to provide at said output terminal an output deflection waveform which is inverted in phase relative to an input deflection waveform appearing at said input terminal, and said output stage including a pair of transistors of opposite conductivity types disposed in a push-pull complementary-symmetry configuration, direct current conductive connections being provided between the emitter electrodes of said transistors and said output terminal;

a deflection coil;

a first capacitor;

a deflection current sampling resistor;

means coupling said deflection coil, said first capacitor and said current sampling resistor, in the order named, between said output terminal and a point of reference potential;

means coupled to the junction of said first capacitor and said resistor for establishing a negative feedback path between said junction and said input terminal, said negative feedback path including a second capacitor;

means, including a discharge stage coupled to said input terminal, for alternately charging and discharging said second capacitor at a vertical deflection rate to develop at said input terminal a sawtooth voltage wave as said input deflection waveform; and wave shaping means having an input coupled to said first capacitor and responsive to a parabolic voltage component developed across said first capacitor, wherein said wave shaping means comprises means for deriving from said parabolic voltage component convergence current waveforms for energizing said beam convergence apparatus.

4. A transistor vertical deflection circuit for use in a television receiver comprising, in combination:

a deflection wave amplifier having an input terminal;

a deflection wave output stage having an output terminal, said deflection wave amplifier and output stage being connected in cascade to provide at said output terminal an output deflection waveform which is inverted in phase relative to an input deflection waveform appearing at said input terminal, and said output stage including a pair of transistors of opposite conductivity types disposed in a push-pull complementary-symmetry configuration, direct current conductive connections being provided between the emitter electrodes of said transistors and said output terminal;

a deflection coil;

a first capacitor;

a deflection current sampling resistor;

means coupling said deflection coil, said first capacitor and said current sampling resistor; in the order named, between said output terminal and a point of reference potential;

means coupled to the junction of said first capacitor and said resistor for establishing a negative feedback path between said junction and said input terminal, said negative feedback path including a second capacitor;

means, including a discharge stage coupled to said input terminal, for alternately charging and discharging said second capacitor at a vertical deflection rate to develop at said input terminal a sawtooth voltage wave as said input deflection waveform; and wave shaping means having an input coupled to said first capacitor and responsive to a parabolic voltage component developed across said first capacitor, wherein said wave shaping means comprises means responsive to said parabolic voltage component for causing S-shaping of said output waveform.

5. In a color television receiver including dynamic beam convergence apparatus, a vertical deflection circuit comprising, in combination:

a vertical deflection output stage including a pair of transistors of opposite conductivity types, direct current conductive connections between the emitter electrodes of said transistors and a common output terminal, direct current conductive connections between the base electrodes of said transistors and an input terminal, a direct current conductive connection between the collector electrode of one of said transistors and a unidirectional voltage supply terminal, and a direct current conductive connection between the collector electrode of the other of said transistors and a point of reference potential;

a vertical deflection yoke winding;

an electrolytic capacitor;

a deflection current sampling resistor;

a load circuit for said output stage including said yoke winding, said capacitor and said sampling resistor connected in series, in the order named, between said output terminal and said point of reference potential, whereby the flow of vertical rate deflection current in said load circuit develops a vertical rate parabolic voltage component across said capacitor and a vertical rate sawtooth voltage component across said resistor;

a phase inverting deflection wave amplifier having an input circuit and an output circuit, said output circuit being direct current conductively connected to said input terminal of said output stage;

means providing feedback of said sawtooth voltage component to said amplifier input circuit;

and means coupled to said capacitor and responsive to said parabolic voltage component for deriving vertical rate convergence current waveforms for said beam convergence apparatus.

6. Apparatus in accordance with claim 5 including additional means providing feedback to said amplifier input circuit of a D.C. component derived from said output terminal in order to effect output stage operating point stabilization.

7. Apparatus in accordance with claim 6 wherein said sawtooth voltage component feedback providing means comprises a second capacitor, and wherein said D.C. component feedback providing means additionally serves to integrate the A.C. voltage waveform appearing at said output terminal and to apply the resultant parabolic waveform via a second resistor to said amplifier input circuit so as to S-shape the current flowing in said yoke winding.

8. Apparatus in accordance with claim 6 wherein said sawtooth voltage component feedback providing means comprises a second capacitor, said apparatus also including resistive means coupled to said first capacitor and responsive to said parabolic voltage component for providing additional feedback to said amplifier input circuit so as to S-shape the current flowing in said yoke winding.

9. Apparatus in accordance with claim 8 wherein said D.C. component feedback providing means includes means for substantially precluding feedback therethrough of A.C. components.

10. Apparatus in accordance with claim 5 wherein the value of said capacitor is chosen to present an impedance at vertical deflection frequency which is many times larger than the impedance presented by said sampling resistor.

* * * * *